(12) United States Patent
Marangon et al.

(10) Patent No.: US 12,147,785 B2
(45) Date of Patent: Nov. 19, 2024

(54) SYSTEM AND METHOD TO GENERATE BIASED RANDOM BIT STREAMS AND QUANTUM COMMUNICATION SYSTEM AND METHOD

(71) Applicant: Kabushiki Kaisha Toshiba, Tokyo (JP)

(72) Inventors: Davide Giacomo Marangon, Cambridge (GB); Mirko Sanzaro, Cambridge (GB); Taofiq Paraiso, Cambridge (GB); Thomas Roger, Cambridge (GB); Innocenzo De Marco, Cambridge (GB); Zhiliang Yuan, Cambridge (GB); Andrew James Shields, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 939 days.

(21) Appl. No.: 17/187,508

(22) Filed: Feb. 26, 2021

(65) Prior Publication Data

US 2022/0164165 A1    May 26, 2022

(30) Foreign Application Priority Data

Nov. 20, 2020 (GB) ...................... 2018328

(51) Int. Cl.
*G06F 7/58* (2006.01)
*G06N 10/00* (2022.01)
(Continued)

(52) U.S. Cl.
CPC .............. *G06F 7/58* (2013.01); *G06N 10/00* (2019.01); *H03K 3/84* (2013.01); *G06F 7/588* (2013.01); *H03K 19/20* (2013.01)

(58) Field of Classification Search
CPC .. G06F 7/58–588; G06N 10/00; G06N 10/40; H03K 19/20; H03K 3/84
See application file for complete search history.

(56) References Cited

U.S. PATENT DOCUMENTS

| 2009/0204657 A1 | 8/2009 | Goettfert et al. |
| 2011/0029588 A1* | 2/2011 | Ross .......................... G06F 7/58 |
| | | 708/250 |

(Continued)

FOREIGN PATENT DOCUMENTS

| GB | 2529228 A * | 2/2016 | ............. G06F 7/588 |
| GB | 2530346 B | 7/2017 | |

(Continued)

OTHER PUBLICATIONS

A. Marghescu et al., High Speed and Secure Variable Probability Pseudo/True Random Number Generator using FPGA, 2015 IEEE 21st International Symposium for Design and Technology in Electronic Packaging (SIITME), 2015 (Year: 2015).*

(Continued)

*Primary Examiner* — Emily E Larocque
(74) *Attorney, Agent, or Firm* — Oblon, McClelland, Maier & Neustadt, L.L.P.

(57) ABSTRACT

A system for generating a biased random bit stream, wherein said biased bit stream has different predetermined probabilities of occurrence for bit "0" and bit "1", said system comprising:
  a true random generator unit configured to output a true random bit stream,
  a pseudo random generator unit configured to output a pseudo random bit stream, said pseudo random bit stream comprising n bit words, where n is an integer of at least two;
  a combining unit configured to combine a bit from said true random generator unit with an n-bit word from said pseudo random generator unit to output a processed n-bit word; and
  an output unit configured to generate an output bit value from said processed n-bit word using a function, wherein said function is selected to control the prob- (Continued)

abilities of occurrence of the bit "0" values and bit "1" values to be the predetermined probabilities of occurrence.

20 Claims, 6 Drawing Sheets

(51) Int. Cl.
*H03K 3/84* (2006.01)
*H03K 19/20* (2006.01)

(56) References Cited

U.S. PATENT DOCUMENTS

| | | |
|---|---|---|
| 2014/0019502 A1 | 1/2014 | Goettfert et al. |
| 2016/0087796 A1 | 3/2016 | Lucamarini et al. |
| 2018/0129476 A1 | 5/2018 | Wesson et al. |
| 2019/0044713 A1* | 2/2019 | Tomita .................. H04B 10/70 |

FOREIGN PATENT DOCUMENTS

| | | |
|---|---|---|
| JP | 2003-131867 A | 5/2003 |
| JP | 2004-157168 A | 6/2004 |
| JP | 2016-71862 A | 5/2016 |

OTHER PUBLICATIONS

D.G. Marangon et al., Long-Term Test of a Fast and Compact Quantum Random Number Generator, Journal of Lightwave Technology, vol. 36, No. 17, 2018 (Year: 2018).*

K. Siddiqi, Comp 102: Computers and Computing Lecture 3: Truth Tables and Logic Gates, 2015 from 222.cim.mcgill.ca/~siddiqi/102.html (Year: 2015).*

Japanese Office Action issued Oct. 4, 2022 in Japanese Patent Application No. 2021-042263 (with English translation), 10 pages.

Algorithms Dictionary, First edition, Japan, Kykyitsu Kabushiki Kaisha, 1994, pp. 831-834 (13 total pages) (with English translation).

Takahashi et al., "Simulation Engineering", First Edition, Asakura Publishing Co., Ltd., 2007, pp. 16-17 (6 total pages) (with English translation).

Kroese et al., "Handbook of Monte Carlo Methods", First Edition, Asakura Publishing Co., Ltd., 2014, pp. 59-60 (6 total pages) (with English translation).

* cited by examiner

| Time (clock-cycle) | TRNG | PRNG-1 | ... | PRNG-k | ... | PRNG-w | Output |
|---|---|---|---|---|---|---|---|
| 1 (start) | $q_1^1 q_1^2 \ldots q_1^k \ldots q_1^w$ | $l_{1,0}^1 l_{1,1}^1 \ldots l_{1,j}^1 \ldots l_{1,(n-1)}^1$ | ... | $l_{1,0}^k l_{1,1}^k \ldots l_{1,j}^k \ldots l_{1,(n-1)}^k$ | ... | $l_{1,0}^w l_{1,1}^w \ldots l_{1,j}^w \ldots l_{1,(n-1)}^w$ | $b_1^1 b_1^2 \ldots b_1^k \ldots b_1^w$ |
| 2 | $q_2^1 q_2^2 \ldots q_2^k \ldots q_2^w$ | $l_{2,0}^1 l_{2,1}^1 \ldots l_{2,j}^1 \ldots l_{2,(n-1)}^1$ | ... | $l_{2,0}^k l_{2,1}^k \ldots l_{2,j}^k \ldots l_{2,(n-1)}^k$ | ... | $l_{2,0}^w l_{2,1}^w \ldots l_{2,j}^w \ldots l_{2,(n-1)}^w$ | $b_2^1 b_2^2 \ldots b_2^k \ldots b_2^w$ |
| ... | ... | ... | ... | ... | ... | ... | ... |
| i | $q_i^1 q_i^2 \ldots q_i^k \ldots q_i^w$ | $l_{i,0}^1 l_{i,1}^1 \ldots l_{i,j}^1 \ldots l_{i,(n-1)}^1$ | ... | $l_{i,0}^k l_{i,1}^k \ldots l_{i,j}^k \ldots l_{i,(n-1)}^k$ | ... | $l_{i,0}^w l_{i,1}^w \ldots l_{i,j}^w \ldots l_{i,(n-1)}^w$ | $b_i^1 b_i^2 \ldots b_i^k \ldots b_i^w$ |
| ... | ... | ... | ... | ... | ... | ... | ... |
| m (end) | $q_m^1 q_m^2 \ldots q_m^k \ldots q_m^w$ | $l_{m,0}^1 l_{m,1}^1 \ldots l_{m,j}^1 \ldots l_{m,(n-1)}^1$ | ... | $l_{m,0}^k l_{m,1}^k \ldots l_{m,j}^k \ldots l_{m,(n-1)}^k$ | ... | $l_{m,0}^w l_{m,1}^w \ldots l_{m,j}^w \ldots l_{m,(n-1)}^w$ | $b_m^1 b_m^2 \ldots b_m^k \ldots b_m^w$ |

Figure 5

SYSTEM AND METHOD TO GENERATE BIASED RANDOM BIT STREAMS AND QUANTUM COMMUNICATION SYSTEM AND METHOD

CROSS REFERENCE TO RELATED APPLICATION

This application claims the benefit of United Kingdom Application number 2018328.1 filed on Nov. 20, 2020, which is hereby incorporated by reference.

FIELD

Embodiments described herein relate generally to systems and methods for generating biased random bit streams and quantum communication systems and methods.

BACKGROUND

Modelling, simulation and cryptography tools often require strings of random values or bits. For example, strings of random bits are often required for generating data encryption keys, simulating random processes, modelling complex natural phenomena. These strings of random bits may need to be unbiased, meaning every output value has the same chance of occurring (e.g. there is an equal chance of each output bit being a "1" or a "0"), or biased, meaning that the output values do not have the same chance of occurring (e.g. on average there will be twice as many "1"s as "0"s). As such, one specific example of an implementation of an embodiment may be the processing of random strings of values.

Computers, being deterministic systems, are not inherently suitable for producing strings of random values or bits. There are two main approaches to doing so: Pseudo-Random Number Generators (PRNGs) and True Random Number Generators (TRNGs).

TRNGs derive their 'randomness' from physical phenomena. Generally, TRNGs will do this by using measurements from a random natural occurrence to produce a string of random values or bits derived from the measured values. Examples of measured phenomena include atmospheric noise, radioactive decay and transmission of photons through a half-silvered mirror. As the outputs are determined by a natural process, which is inherently random, the output is truly random.

PRNGs are computer implemented algorithms, mathematical formulae or other methods which create a string of values or bits which may, to a certain extent, appear random. Examples of PRNG algorithms which output seemingly random strings of values include linear congruential generators, lagged Fibonacci generators, linear feedback shift registers and algorithms based on computational hardness assumptions.

PRNGs—frequently being computer implemented algorithms—are generally more efficient and can have a higher bitrate than TRNGs and so are often used in many applications where large strings of values or bits are required. However, although such PRNGs may produce outputs which appear random, all PRNGs are, by their very definition, not truly random.

Biased strings of random bits are used in several cryptography techniques, for example in Quantum Key Distribution (QKD). QKD allows two parties to create and share a random secret key, or cipher, in a secure manner using quantum bits, or qubits. QKD theoretically allows the sender (often referred to as "Alice") and receiver (often referred to as "Bob") of the key to tell if an eavesdropper (often referred to as "Eve") has intercepted the communication, compromising the key's security. This relies on the fact that a qubit cannot be measured without affecting the measured property. As such, any such alteration of the received qubits due to Eve's interference can be detected by Alice and Bob.

BRIEF DESCRIPTION OF THE DRAWINGS

FIG. 5 is a synchronisation table for a method in accordance with an embodiment.

DETAILED DESCRIPTION

Figure 1:
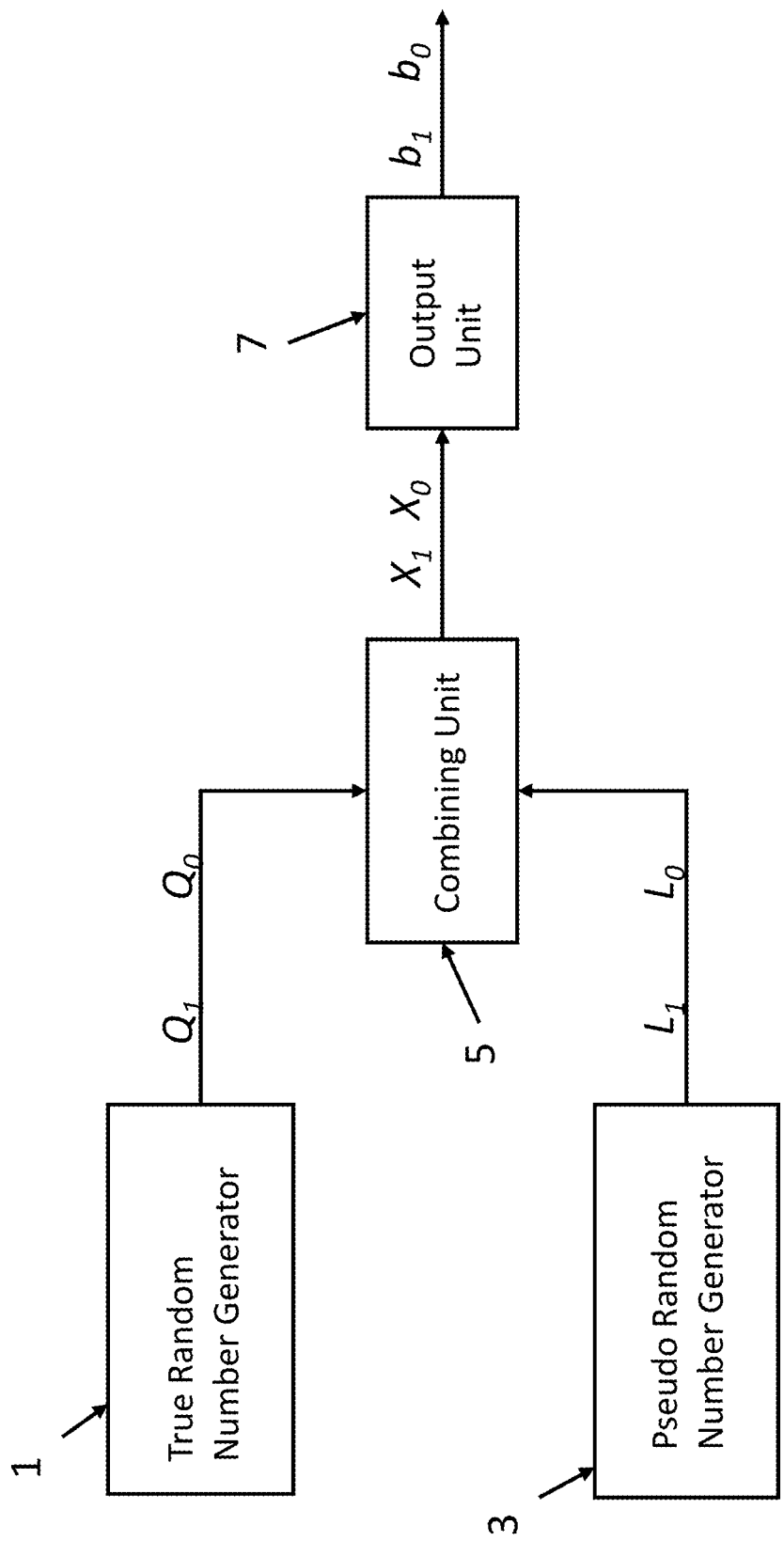
FIG. 1 is a schematic of a system in accordance with an embodiment.

In an embodiment, a system for generating a biased random bit stream is provided, wherein said biased bit stream has different predetermined probabilities of occurrence for bit "0" and bit "1", said system comprising:
  a true random generator unit configured to output a true random bit stream,
  a pseudo random generator unit configured to output a pseudo random bit stream, said pseudo random bit stream comprising n bit words, where n is an integer of at least two;
  a combining unit configured to combine a bit from said true random generator unit with an n-bit word from said pseudo random generator unit to output a processed n-bit word; and
  an output unit configured to generate an output bit value from said processed n-bit word using a function, wherein said function is selected to control the probabilities of occurrence of the bit "0" values and bit "1" values to be the predetermined probabilities of occurrence.

The above system can be used for generating a biased random bit string. An application for system is for quantum communication. Further possible applications for biased strings of random variables include modelling rare events, e.g. rain in the desert; simulating a card game on a computer; and modelling a random walk type problem, e.g. quantum scattering. Such simulations can be performed in real time. These examples, along with other uses in the fields of cryptography, forecasting, gaming and research, require a string of values or bits with the following properties:
  (a) the string of bits must meet a certain assessable quality of randomness;
  (b) the string of bits must be statistically indistinguishable from a comparable (e.g. same value/bit rate and bias) string of values or bits generated by a TRNG; and
  (c) the occurrence frequency (i.e. the bias) of the bits in the output must approximate that selected by a user.

Embodiments described herein attempt to satisfy requirements (a) to (c).

In an embodiment, a system is provided to generate digital random bit streams with said streams featuring a pre-determined proportion of bits with a specific bit value, comprising: one or more TRNG units that sample a physical process to generate true random w-bit word streams,
one or more PRNG units that implement sequential logic to generate pseudo-random n-bit word streams,
one or more combining units to perform digital exclusive-OR operation,
one or more output units that receive as input a digital binary word and output a single bit; one unit to synchronize the operation of all the other units;
wherein the one or more PRNG units are configured to output parallel bit streams whose width can be chosen according to the pre-determined proportion of bits with a specific value in the streams emitted by the system;
wherein the one or more combining units are configured to receive as input one bit generated by the TRNG unit and one n-bit word generated by a PRNG unit;
wherein the one or more combining units are configured to output a binary stream whose bit values correspond to the result of exclusive-OR operation between the input bit received from the TRNG unit and each bit in the word received from a PRNG unit;
wherein an output unit is configured to receive as input the n-bit word outputted by a corresponding combining unit and output 1-bit, whose value is determined by a function that can be programmed in the unit; the function programmed in output unit is chosen according to the pre-determined proportion of bits with a specific value in the streams emitted by the system.

In an embodiment, the combining unit comprises an exclusive OR gate configured to exclusively OR each bit of said n-bit word with the same bit from said true random number generator unit.

The output unit may comprise a processor configured to output a word value representing said word and compare said word value with a threshold, the processor being further configured to allocate a first bit value to word values above said threshold and allocate a second bit value for word values below said threshold, said first bit value selected from bit "1" and bit "0" and the second bit value being the other of bit "1" and bit "0", said threshold and said value of n being selected to control the probabilities of occurrence of the bit "0" values and bit "1" values to be the predetermined probabilities of occurrence.

The output unit may comprise combinatorial logic components to implement the function. For example LUTs may be used to implement the threshold. In a further embodiment, the function uses a look-up-table (LUT) that associates pre-determined Xi words to either bit 0 or 1. For example, with n=4, $\{0000\} \to 0$, $\{1111\} \to 0$, whereas all other combinations $\{1000\}$, $\{0100\}$, ... $\to 1$.

In a further embodiment, the output unit may comprise a plurality of logic units configured to logically combine the bit values of an n-bit word to produce a single bit value for said word, wherein n is selected to control the probabilities of occurrence of the bit "0" values and bit "1" values to be the predetermined probabilities of occurrence. For example, the plurality of logic units comprises a plurality of AND gates configured to combine the bit values within the n-bit word.

The system may be configured to output a plurality of parallel random bit streams, wherein the true random generator unit is configured to output a plurality of parallel true random bit streams, the combining unit is configured to combine a bit from one of said bit streams of said true random generator unit with an n-bit word from said pseudo random generator unit to output a processed n-bit word; said outputting unit being configured to generate an output bit value from each processed n-bit word to produce parallel output bit streams. Where there are parallel bit streams the value of n can be set separately for each bit stream.

In an embodiment, the combining unit is configured such that each bit stream of said plurality of pseudo random bit streams are combined with a bit stream from the plurality of parallel true random bit streams produced by the true random number generator unit to produce a plurality of parallel bit streams of processed words, the output unit configured to generate output bit values from said parallel bit streams of processed words.

The true random generator unit may comprise a Quantum Random Number Generator. The quantum random number generator may comprise a gained-switched diode lasers.

The pseudo random number generator unit may comprise a processor running an algorithm adapted to generate random numbers.

In an embodiment, said combining unit may comprise a digital component such as an FPGA, ASIC etc. The output unit may also comprise a digital component such as an FPGA, ASIC etc. The same digital component may form part of the output unit and the combining unit.

The pseudo random number generating unit may comprise a plurality of pseudo random number generators each outputting a bit stream of random numbers or a single generator may provide all streams.

In a further embodiment, a method for generating a biased random bit stream is provided, wherein said biased bit stream has different predetermined probabilities of occurrence for bit "0" and bit "1", said method comprising:
using a true random generator unit configured to output a true random bit stream,
generating a pseudo random bit stream, said pseudo random bit stream comprising n bit words, where n is an integer of at least two;
combining a bit from said true random generator unit with an n-bit word from said pseudo random generator unit to output a processed n-bit word; and
generating an output bit value from said processed n-bit word using a function, wherein said function is selected to control the probabilities of occurrence of the bit "0" values and bit "1" values to be the predetermined probabilities of occurrence.

In an embodiment, the above systems can be used for quantum cryptography. Quantum cryptography comprises a large set of different protocols to implement quantum key distribution (QKD). Some protocols require the use of random bits of unpredictable origin but, at the same time, with not equal probability of occurrence. In some cases, within the same protocol, some tasks require bits drawn from a uniform distribution and other task require bits drawn from a not uniform distribution.

In order to obtain unpredictable random bit, physical (true) random number generators (TRNG) as discussed above are usually employed in the QKD systems. However, TRNGs are usually optimized to generate unbiased streams, i.e., streams with the same probability of occurrence for the two possible bit values. The most unpredictable TRNGs extract random bits from a quantum process (QRNG). These QRNG generally produce a limited number of bits per clock cycle, which cannot be used to generate random variables with biased probability of occurrence at a rate compatible with state-of-the-art QKD systems.

However, the above described system provides a deterministically biased random number generator (DB-RNG), which generates arbitrarily biased, i.e., non-uniform bit streams, by suitably combining the bit stream of a TRNG and one or more bit streams from one or more PRNGs. The PRNGs are used to create the bias, whereas the TRNG is used to preserve unpredictability.

In an embodiment, the PRNGs are implemented—but not exclusively—with digital programmable devices and operated in a way that they generate one or more bits, for each bit generated per (arbitrary) unit time by the TRNG. As the PRNGs match the generation rate of the TRNG, the biased bit streams can be output in real time without being necessary to store or accumulate bits.

In an embodiment, a sending unit for a quantum communication system is provided, the sending unit comprising:
a quantum bit source configured to generate a plurality of quantum bits for sending to a receiving unit;
an intensity modulator arranged to modulate the intensity of a portion of the quantum bits; and
a phase modulator arranged to modulate the phase of a portion of the quantum bits; wherein the intensity modulator and phase modulator are configured to receive a biased output string from a system as described above In an embodiment, a receiving unit for a quantum communications system is provided, the receiving unit comprising:
at least one detector for detecting received quantum bits;
a phase modulator arranged to modulate the phase of a portion of the received quantum bits for measurement;
wherein the phase modulator is configured to receive a biased output string from a system as described above.

In a further embodiment, a quantum communication system is provided comprising:
a sending unit comprising:
a quantum bit source configured to generate a plurality of quantum bits for sending to a receiving unit; and
an intensity modulator arranged to modulate the intensity of a portion of the quantum bits; and
a phase modulator arranged to modulate the phase of a portion of the quantum bits;
and
a receiving unit comprising:
at least one detector for detecting received quantum bits;
a phase modulator arranged to modulate the phase of a portion of the received quantum bits for measurement;
wherein at least one of the intensity modulator and phase modulator in the sending unit and the phase modulator in the receiving unit are configured to receive a biased output string from a system as described above.

FIG. 1 is a diagram showing a system for generating a biased random number stream in accordance with an embodiment. The system is configured to output a m-bit wide random word $B=\{b_0 \; b_1 \ldots b_i \ldots b_{(m-1)}\}$ in which the event of a bit b taking the value 1 has a specific target probability $p(b=1)=y$. A bit b is generated every clock cycle. As used herein, m is an integer of at least 2.

The system comprises a true random number generator TRNG 1 which in an embodiment derives its 'randomness' from physical phenomena. The TRNGs may be configured to perform measurements from a random natural occurrence to produce a string of random values or bits derived from the measured values. For example, measured phenomena such as atmospheric noise, radioactive decay and transmission of photons through a half-silvered mirror. The TRNG may also be a Quantum Random Number Generator (QRNG). In QRNGs, the source of randomness is physical and relies on the unpredictability of a measurement, and, in particular, the unpredictability relies on a quantum mechanical property. QRNGs can be implemented using gained-switched diode lasers. In gain-switched diode lasers, the lasing threshold is governed by spontaneous emission, which is a quantum mechanical process, such that the phase of the emitted pulse is random. By repeatedly switching the diode laser on and off, a stream of optical pulses, each having a random phase, can be generated. By measuring the random phase of each optical pulse in the stream of optical pulses, a sequence of random numbers can be obtained.

As the outputs are determined by a natural process, which is inherently random, the output is truly random. In this embodiment, TRNG 1 generates a binary stream (1-bit every clock cycle), $Q_i = q_{i,0}$.

The system of FIG. 1 also comprises pseudo random number generator PRNG 3. PRNGs may be computer implemented algorithms, mathematical formulae or other methods which create a string of values or bits which may, to a certain extent, appear random. Examples of PRNG algorithms which output seemingly random strings of values include linear congruential generators, lagged Fibonacci generators, linear feedback shift registers and algorithms based on computational hardness assumptions. In this embodiment, the PRNG is configured to output an unbiased bit stream. In this example, the unbiased bit stream outputted by PRNG 3 is output in the form of n-bit wide words $L_i = \{l_{i,0} \; l_{i,1} \ldots l_{i,j} \ldots l_{i,(n-1)}\}$ every clock cycle by means of an unbiased pseudo random number generator (PRNG).

The output of TRNG 1 and PRNG are then input into combining unit 5 which is configured to generate a processed n-bit wide word $X_i$ from the a word $L_i$ and bit $q_{i,0}$. However, this is achieved, will be explained with reference to FIGS. 3 and 4. In an embodiment, this is achieved by taking the logical exclusive-OR ($\oplus$) between each bit of $L_i$ and the bit $q_{i,0}$ of $Q_i$, i.e., $X_i = \{x_{i,0} \; x_1 \ldots x_{i,j} \ldots x_{i,(n-1)}\}$ where $x_{i,j} = l_{i,j} \oplus q_{i,0}$. To perform this operation, the combining unit may comprise a plurality of exclusive-OR gates each configured to receive an input of a bit of word $L_i$ and bit $q_{i,0}$. To achieve this operation, combining unit 5 may be an FPGA.

The system further comprises an output unit 7 configured to receive processed n-bit wide words $X_i = \{x_{i,0}, x_{i,1} \ldots x_{i,j} \ldots x_{i,(n-1)}\}$ and output a single bit $b_i$ corresponding to each input word $L_i$. In one embodiment, the output unit 7 inputs word $X_i$ to a predefined function $f$ that outputs either $b_i = 0$ or $b_i = 1$.

The function $f$ is defined in advance according to the target probability $p(b=1)$, i.e., $f: X_i \rightarrow b_i$ maps $0 \leq t \leq 2^n$ out of the $2^n$ possible outcomes of $X_i$ to bit value $b_i = 0$ and the remaining $2^n - t$ to $b_i = 1$. In one embodiment, this can be done by determining a value for the word $L_i$, for example calculating the value of the word from its bit values and comparing with a threshold k such that is word value >t then b=1 and b=0 otherwise or vice versa. Of course other functions could also be used.

The function $f$ is not to be changed until all the m bits of word B are generated. If $t > 2^{n-1}$, $p(b=1) < \frac{1}{2}$ and B will be biased towards bit value 0, for $t < 2^{n-1}$ the B will be biased towards bit value 1, whereas for $t = 2^{n-1}$ the B will be unbiased. More specifically, one obtains $$p(b=1) = \frac{2^n - t}{2^n},$$

so the values n and t can be selected in order to exactly match or closely approximate the target value $p(b=1)=y$.

Further embodiments for the combining unit are also possible. For example, in a second embodiment, it is desired to output a random m-bit wide word $B=\{b_0\ b_1\ \ldots\ b_i\ \ldots\ b_{(m-1)}\}$, in which the event of a bit b taking the value 0 is more likely than 1, i.e., with probability $$p(b=1) = \frac{1}{2^n}$$

with $n>1$.

In such an embodiment, TRNG 1, PRNG 3 and combining unit 5 operate in the same manner as described above. However, here, the output unit 7 obtains the target bit $b_i$ by taking the logical AND reduction ($\wedge$) of the $X_i$ bits, i.e., $b_i = x_{i,0} \wedge x_{i,1} \wedge \ldots \wedge x_{i,(j-1)} \wedge x_{i,j} \ldots \wedge x_{i,(n-1)}$.

If it is assumed that $p(l_{i,j}=1)=\frac{1}{2}$, then it follows that $p(x_{i,j}=1)=\frac{1}{2}$. This then implies that $$p(b=1) = \frac{1}{2^n}.$$

The above discussion of FIG. 1 has assumed a simplified case where it is desired to output an m-bit wide word $B=\{b_0\ b_1\ \ldots\ b_i\ \ldots\ b_{(m-1)}\}$. However, it is also possible to configured the system to output parallel streams of m-bit wide words $B=\{b_0\ b_1\ \ldots\ b_i\ \ldots\ b_{(m-1)}\}$.

Such a system in shown in FIG. 1. In this embodiment, it is assumed that a set of w random m-bit wide words $\{B^0, B^1, \ldots, B^k, B^{(w-1)}\}$ is to be generated with $B^k = \{b_0^k\ b_1^k\ \ldots\ b_i^k\ \ldots\ b_{(m-1)}^k\}$, in which the event of a bit $b^k$ taking the value 0 is more likely than 1, i.e., with probability $$p(b^k = 1) = \frac{1}{2^n}$$

with $n>1$.

As explained above with reference to FIG. 1, PRNG units 102 is used to generate pseudo random words. However, in FIG. 2, a set of w n-bit wide words $\{L_i^0, L_i^0, \ldots, L_i^k, \ldots, L_i^{(w-1)}\}$ 104 with $L_i^k = \{l_{i,0}^k\ l_{i,1}^k\ \ldots\ l_{i,j}^k\ \ldots\ l_{i,(n-1)}^k\}$ are generated in parallel. It is possible for a plurality of PRNG units to be used where each unit outputs a stream or for there to be a single PRNG unit as will be explained with reference to FIG. 3.

For those same target bits $b_i^k$, physical TRNG 101 is used to generate a w-bit wide word 103 $Q_i = \{q_{i,0}\ q_{i,1}\ \ldots\ q_{i,k}\ \ldots\ q_{i,(w-1)}\}$.

A plurality of combining units 105 can then be used to generate a set of w n-bit wide processed words $\{X_i^0, X_i^1, \ldots, X_i^k, \ldots, X_i^{(w-1)}\}$ 106 by taking the logical exclusive-OR ($\oplus$) between the bits of each $L_i^k$ and the bit $q_{i,k}$ of $Q_i$, i.e., $X_i^k = \{x_{i,0}^k\ x_{i,1}^k\ \ldots\ x_{i,j}^k\ \ldots\ x_{i,(n-1)}^k\}$ where $x_{i,j}^k = l_{i,j}^k \oplus q_{i,k}$.

The target bits $b_i^k$ are then obtained by taking the logical AND reduction ($\wedge$) of the bits in $X_i^k$, i.e., $b_i^k = x_{i,0}^k \wedge x_{i,1}^k \wedge \ldots \wedge x_{i,(j-1)}^k \wedge x_{i,j}^k \ldots \wedge x_{i,(n-1)}^k$ using output unit 107 which outputs single bits 108 $B^0, B^1, \ldots, B^k, \ldots, B^{(w-1)}$.

Figure 3:
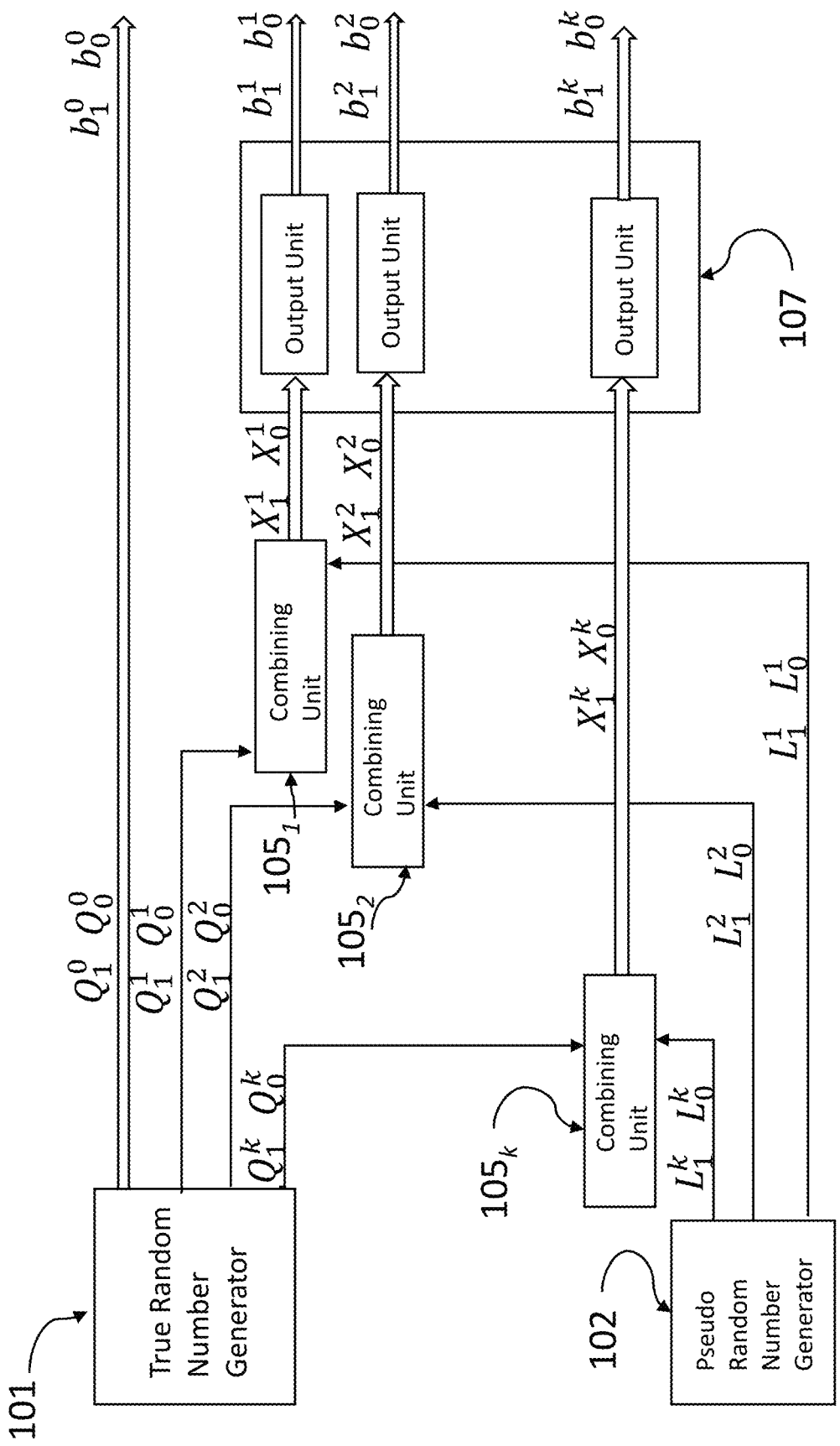
FIG. 3 is a schematic of a system in accordance with an embodiment having multiple output bit streams with one output stream being an unbiased output stream.

It can be seen from the above that the system can be used to generate multiple streams with different probabilities. For example, if the stream $B^{(k-1)}$ requires a probability $p(b^{(k-1)}=1)<p(b^k=1)$, it will be then sufficient to generate words $L_i^{(k-1)} = \{l_{i,0}^{(k-1)}\ l_{i,1}^{(k-1)}\ \ldots\ l_{i,j}^{(k-1)}\ \ldots\ l_{i,(s-1)}^{(k-1)}\}$ and $L_i^k = \{l_{i,0}^k\ l_{i,1}^k\ \ldots\ l_{i,j}^k\ \ldots\ l_{i,(n-1)}^k\}$ with $s>n$. It is also possible as shown in FIG. 3 for one (or more) of the bits produced by TRNG 1 to be output directly as an unbiased bit stream. FIG. 3 shows the arrangement where $B^0$ is taken directly from the output of the TRNG 101.

Figure 2:
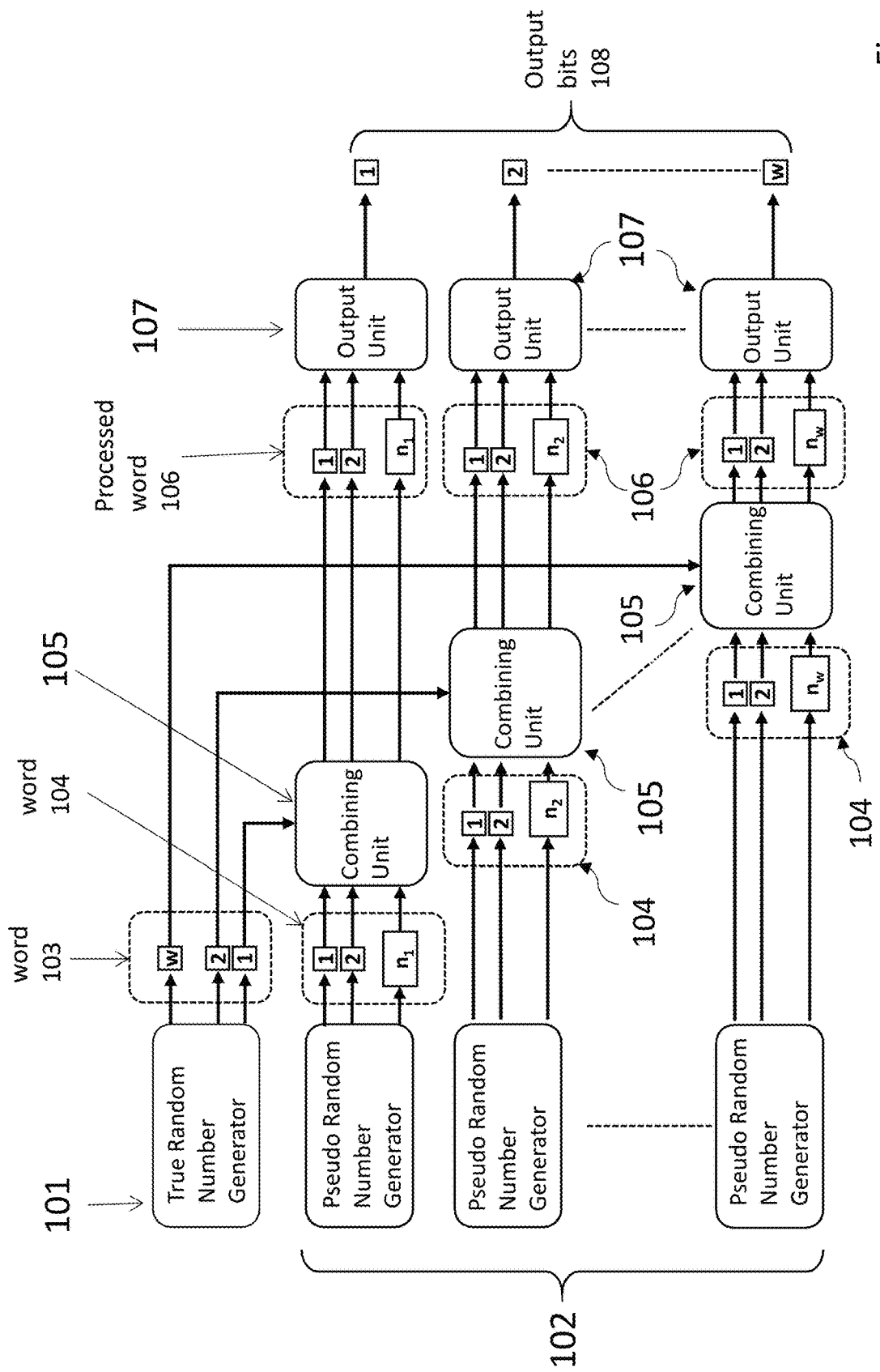
FIG. 2 is a schematic of a system in accordance with an embodiment having multiple output bit streams.

In the above example explained with reference to FIG. 2, the output unit uses a logical AND reduction. However, the output unit 7 could also use the method discussed first where a function is used, for example where a threshold "t" is selected.

In the above embodiments described with reference to FIGS. 2 and 3, the probability of occurrence of a bit for each of the parallel bit streams can be controlled independently of the other bit streams. Both the value of n can be changed for each of the parallel bits streams and the value of t (if appropriate) can be changed independently for each bit stream.

Figure 4:
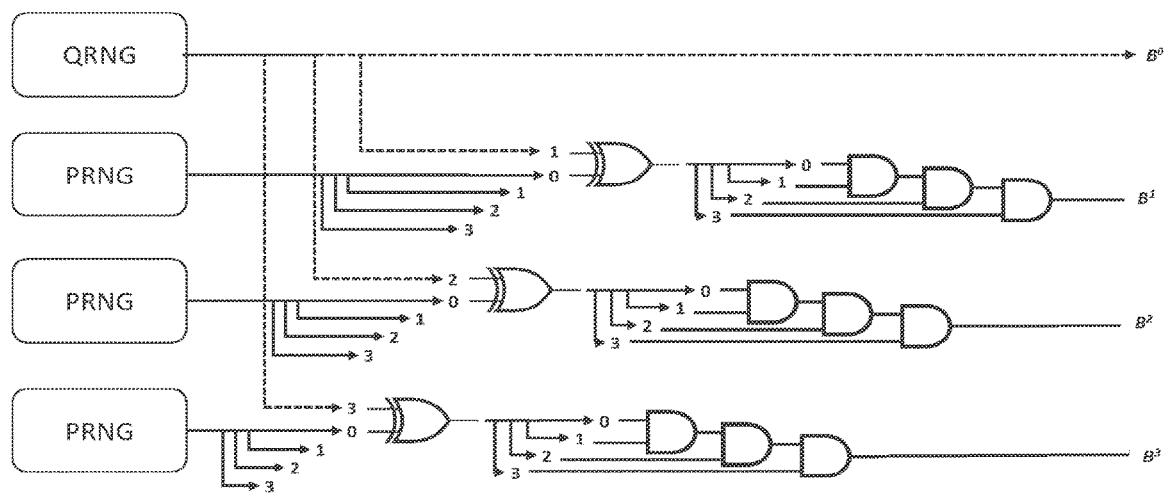
FIG. 4 is a schematic of a system in accordance with an embodiment having multiple output bit streams wherein the output bits are produced using logical AND operations.

FIG. 4 is a schematic of a system which is based on FIG. 3, but where the output units use logical AND reduction.

As an illustration of the above, FIG. 5 is a table showing the synchronisation between the TRNG and PRNGS. The first column shows the clock cycle. In the first clock cycle, the TRNG outputs a plurality of bits. In this example, the TRNG outputs w bits in the first clock cycle, each bit is indexed with k. Each of the w bits is then combined with a word from a PRNG. In this example, there are w PRNGs, thus there is a bit from the TRNG per clock cycle for each PRNG. Following the above method, a bit $b_1^k$ is output from combining the word from each PRNG with its respective TRNG bit as described.

In the above embodiments, DB-RNG data flows can be pipelined with shorter latency times. In addition, due to the simpler digital processing involved, the maximum clock rate can be higher.

If the TRNG produces less than the numbers of bits required (in the above able w bits), in order to maintain the speed, one has to provide the remaining bits. One solution is to use one TRNG, but store bits from multiple cycles and accumulate the bits in memory until the number of required bits is reached. However, this solution will create delays since it requires the output of the TRNG over two or more cycles to produce output bits from one cycle. In another embodiment, two bits from a single TRNG could be combined by an XOR gate to provide a further bit. Such a solution would be appropriate if the TRNG produces one less bit than required. This scheme has an advantage that it would allow the generation of the biased bits real time to still be performed even if the TRNG produces less bits than required. Further, the production of extra bits from those output by the TRNG avoids the need to accumulate bits in memory.

The required number of bits to be output in a cycle is determined by the intended use of the bits. In an embodiment, that will be described below, the output stream of bits is used in quantum communication. Some quantum communication protocols require a certain number of random bits to be provided per cycle in order to achieve control over the bit to be sent, the basis and also control of the intensity modulator. Control over the intensity modulator allow protocols, so called "decoy state protocols" to be used that can detect the presence of an eavesdropper. In an efficient form of the BB84 protocol with decoy states, 1 bit is required to provide the bit to be sent, 1 bit for the choice of the basis and 2 bits for the choice of the intensity.

Figure 6:
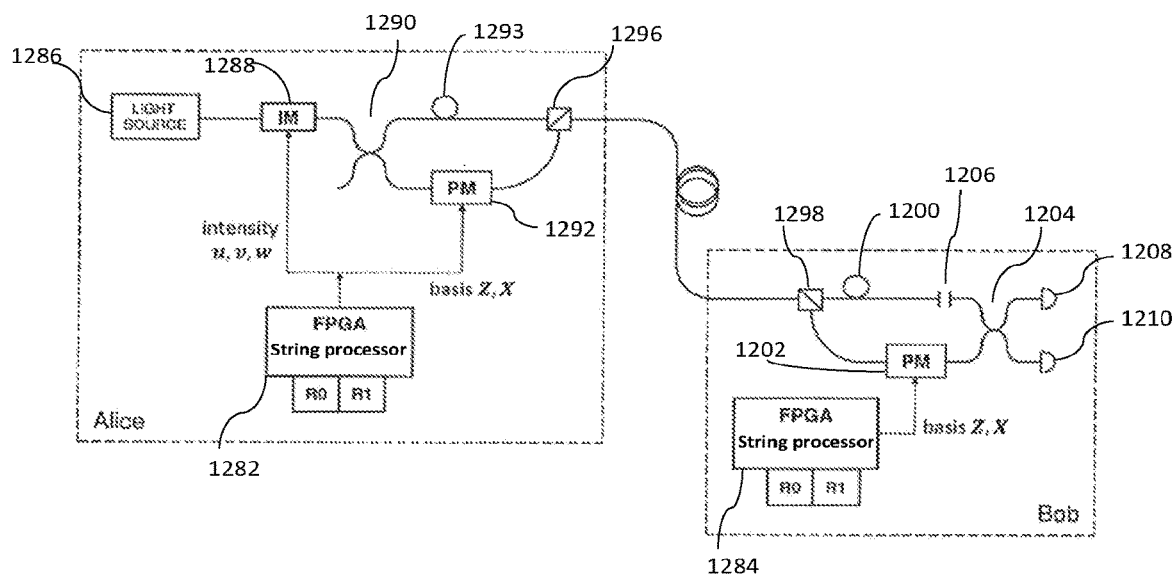
FIG. 6 is a schematic of a quantum communication system in accordance with an embodiment.

Next, the system described with reference to FIGS. 1 to 4 will be implemented in a quantum communication system. FIG. 6 is an example of a quantum communication system.

FIG. 6 shows a schematic illustration of a Quantum Key Distribution (QKD) system. QKD allows two parties to create and share a random secret key, or cipher, in a secure manner using quantum bits, or qubits. QKD theoretically allows the sender (often referred to as "Alice") and receiver (often referred to as "Bob") of the key to tell if an eavesdropper (often referred to as "Eve") has intercepted the communication, compromising the key's security.

This relies on the fact that a qubit cannot be measured without affecting the measured property. As such, any such alteration of the received qubits due to Eve's interference can be detected by Alice and Bob.

A quantum bit may be encoded in a light pulse or in a single-photon pulse. A quantum bit source may be a source of light pulses or of single photons. A source of light pulses may be implemented according to the embodiments described herein.

The QKD system may use light. Embodiments disclosed herein may control the light intensity values. Embodiments disclosed herein may control the encoding and/or decoding bases prescribed by the QKD protocol. A particular example may be the BB84 protocol with decoy states, wherein an embodiment according to the present disclosure may output three values: u, v and w, which may correspond to a "signal", "decoy" and "vacuum" state, respectively. It may be desirable for each of these output values to occur with a different output frequency. As such, a string processor as described herein may be used in such a QKD system. Another example is the so-called "efficient BB84 protocol" where in, an embodiment, two bases, Z and X, may be used. These bases can be selected with different occurrence probabilities. As such, a RNG as described below may be used. It is also possible to have jointly an efficient BB84 protocol with decoy states. In this case, multiple output symbols (Zu, Zv, Zw, Xu, Xv, Xw) have to be selected with different probabilities and the RNG described below may be used.

The QKD system comprises two field programmable gate array (FPGA) string processors 1282 and 1284 in the sending unit (Alice) and receiving unit (Bob).

In FIG. 6, a QKD setup to implement the standard or the efficient version of the decoy-state BB84 protocol is depicted. The embodiment of FIG. 5 illustrates a sender, Alice, sending an encrypted key to a receiver, Bob. A light source 1286, or photon source, generates a light pulse which is then passed through an intensity modulator 1288. The intensity modulator 1288 implements the decoy-state method, wherein each light pulse or photon is randomly modulated to one of a number of predetermined intensities $\{u, y, w\}$, corresponding to "signal", "decoy" or "vacuum", respectively; and these predetermined intensities occur with an occurrence frequency determined by the user $\{f_u, f_v, f_w\}$. A string processor, comprising a random number generator as described with reference to FIGS. 1 to 4 above is used to control the intensity modulator 1288, providing three outputs (each corresponding to a certain intensity) with a quality-assured level of randomness and with a predetermined bias. The string processor can comprise an FPGA to conduct the combining and output functions as described above.

The intensity-modulated pulses are then split by an input beam splitter 1290. One path—the "first path"—goes through a phase modulator 1292 after the beam splitter 90. The phase modulator 1292 randomly modulates the photons by a specific phase, thus outputting the photons with one of (in this embodiment) two bases $\{Z, X\}$. The occurrence ratio between the two bases may be biased or unbiased, and predetermined by a user. In the former case, the efficient version of the BB84 protocol is realized; in the latter case, the standard version of the BB84 protocol is realized. The invention disclosed herein can cover both cases, with the unbiased case as a trivial particular case. A string processor, or FPGA string processor 1282 according to an embodiment is used to control the phase modulator 1292 for the basis selection. The FPGA 1282 controlling the basis selection in the phase modulator 1292 of FIG. 5 is equivalent to the FPGA 1282 that controls the intensity modulator 1288. Alternatively, a different string processor or FPGA according to an embodiment may be used to control the phase modulator 1292.

The second path from the input beam splitter 1290 is sent through an optical delay 1293.

Light pulses or photons from the first and second path are then sent to the receiver, Bob, via an optical transmission line 1294 and two polarising beam splitters 1296 and 1298. Alice's polarising beam splitter 1296 rotates and combines polarised pulses or photons from the two different paths and send them through the optical transmission line 1294. As the pulses or photons are polarised, Bob's polarising beam splitter 1298 separates them and directs them onto the two paths of his interferometer, this time sending the pulses or photons sent through Alice's phase modulator 1292 through an optical delay 1200 and the pulses or photons not sent through Alice's phase modulator 1292 through phase modulator 1202. This way, the pulses or photons can reach the final beam splitter 1204 at the same time and can interfere.

Bob's phase modulator 1202 randomly selects one of two bases in which to measure the received pulses or photons, by selecting a phase modulation value. Similar to Alice's phase modulator 1292, Bob's phase modulator 1202 randomly modulates the photons by a specific phase, thus effectively measuring through the detectors 1208 and 1210 the photons with one of (in this embodiment) two bases $\{Z, X\}$. The occurrence ratio between the two bases is biased, and predetermined by a user to be equal to that of Alice's phase modulator 1292. A further string processor or FPGA string processor 1284 according to an embodiment may be used to control this second phase modulator 1202 for the basis selection.

The two paths in the receiver are then again combined at the output beam splitter 1204. To ensure the two optical delays 1293 and 1200 combine to ensure that both overall paths experience the same delay, a variable delay line 1206 fine tunes the delay in the receiver.

Photon detectors 1208 and 1210 are then used to measure the result of the interference between the pulses or photons on the two paths; and from these results the key may be derived. For example, the key bit value 0 can be assigned if detector 1208 clicks while the key bit value 1 can be assigned if detector 1210 clicks.

In the above, Alice's phase modulator 1292 and Bob's phase modulator 1202 are configured to encode and decode quantum bits respectively.

Next, an example will be presented to illustrate the operation of the method for the generation of biased bit streams to be used in the T12 QKD protocol. This protocol, a mentioned above, requires a true random w=4 streams $\{B^0, B^1, B^2, B^3\}$. At each iteration i, one bit from $B^0$ and $B^1$ are used to select two events respectively, i.e., the choice of the bit value $\{0,1\}$ and the choice of the qubit coding basis $\{Z, X\}$. Streams $B^2$ and $B^3$ are used to choose three possible intensities the so-called signal, vacuum and decoy.

In this embodiment, with exception of the bit selection event, all other choices are required to be heavily biased. Convenient probabilities for the different events are listed in the first column of the following table. The bit streams and the coding used to select the events are reported in the second and third column respectively.

| Event Target probability | Bit Streams | Event Coding |
|---|---|---|
| p(bit 1) = ½ | $B^0$ | $b^0 = 0 \rightarrow$ select bit value 0 |
| | | $b^0 = 1 \rightarrow$ select bit value 1 |
| $p(\text{basis } X) = \frac{3}{2^4} = 0.1875$ | $B^1$ | $b^1 = 0 \rightarrow$ select base Z |
| | | $b^1 = 1 \rightarrow$ select base X |
| p(vacuum) ≈ 0.059 | {$B^2$, $B^3$} | {$b_i^2 = 0, b_i^3 = 0$} → select signal |
| p(decoy) ≈ 0.059 | | {$b_i^2 = 1, b_i^3 = 1$} → select signal |
| p(signal) ≈ 0.882 | | {$b_i^2 = 1, b_i^3 = 0$} → select vacuum |
| | | {$b_i^2 = 0, b_i^3 = 1$} → select decoy |

According to the target probabilities for the different events, the user pre-defines the following functions for the respective events:

basis choice: n=4, t=13, $f_{basis}$: $X^1 \rightarrow b^1$ such that $f_{basis}(X^1)=0$ if the $X^1$ decimal representation $\{x_{i,0}^1 x_{i,1}^1 x_{i,2}^1 x_{i,3}^1\}_{10} \in \{0, 1, \ldots, 12\}$ and $f_{basis}(X^1)=1$ if $\{x_{i,0}^1 x_{i,1}^1 x_{i,2}^1 x_{i,3}^1\}_{10} \in \{13,14,15\}$ vacuum choice: n=4, t=15, $f_{vacuum}$: $X^2 \rightarrow b^2$ such that $f_{basis}(X^2)=0$ if the $X^2$ decimal representation $\{x_{i,0}^1 x_{i,1}^1 x_{i,2}^1 x_{i,3}^1\}_{10} \in \{0, 1, \ldots, 14\}$ and $f_{basis}(X^2)=1$ if $\{x_{i,0}^1 x_{i,1}^1 x_{i,2}^1 x_{i,3}^1\}_{10}=15$ decoy choice: n=4, t=15, $f_{decoy}$: $X^3 \rightarrow b^3$ such that $f_{basis}(X^3)=0$ if the $X^3$ decimal representation $\{x_{i,0}^1 x_{i,1}^1 x_{i,2}^1 x_{i,3}^1\}_{10} \in \{0, 1, \ldots, 14\}$ and $f_{basis}(X^3)=1$ if $\{x_{i,0}^1 x_{i,1}^1 x_{i,2}^1 x_{i,3}^1\}_{10}=15$ Then at each iteration i:

the QRNG $Q_i = \{q_{i,0} q_{i,1} q_{i,2} q_{i,3}\}$. Bit $q_{i,0}$ is directly used to select the qubit bit value, i.e., $q_{i,0}=b_i^0$. Since the QRNG is unbiased, $p(b_i^0=1)=1/2$ PRNG1 generates $L_i^1 = \{l_{i,0}^1 l_{i,1}^1 l_{i,2}^1 l_{i,3}^1\}$. Each of these bits is XORed with bit $q_{i,1}$, generating in this way $X_i^1 = \{x_{i,0}^1 x_{i,1}^1 x_{i,2}^1 x_{i,3}^1\}$. The bit value $b_i^1$ that will select the basis is then obtain by applying $f_{basis}$ to $X_i$. It is obvious that $p(b_i^1=1)=1/2^4$.

PRNG2 and PRNG3 generate $L_i^2 = \{l_{i,0}^2 l_{i,1}^2 l_{i,2}^2 l_{i,3}^2\}$ and $L_i^3 = \{l_{i,0}^3 l_{i,1}^3 l_{i,2}^3 l_{i,3}^3\}$ respectively. The two words are respectively XORed with bits $q_{i,2}$ and $q_{i,3}$, generating in this way $X_i^2 = \{x_{i,0}^2 x_{i,1}^2 x_{i,2}^2 x_{i,3}^2\}$ and $X_i^3 = \{x_{i,0}^3 x_{i,1}^3 x_{i,2}^3 x_{i,3}^3\}$. By applying $f_{vacuum}$ and $f_{decoy}$ to $X_i^2$ and $X_i^3$ bits $b_i^2$ and $b_i^3$ are obtained. At this point $p(b_i^2=1)=1/2^4$ and $p(b_i^3=1)=1/2^4$.

The vacuum event will be selected with a probability $p(b_i^2=1)(1-p(b_i^3=1)) \approx 0.059$. The decoy event will be selected with a probability $(1-p(b_i^2=1))p(b_i^3=1) \approx 0.059$. The signal event will be selected with a probability $p(b_i^2=1)p(b_i^3=1)+(1-p(b_i^2=1))(1-p(b_i^3=1)) \approx 0.882$.

Using the above method the three functions $f_{basis}$, $f_{vacuum}$ and $f_{decoy}$ can be conveniently set.

The above example uses an output function to control the occurrence probability of the output bits. The below example uses logical AND reduction in the output unit.

| Event Target probability | Bit Streams | Event Coding |
|---|---|---|
| p(bit 1) = ½ | $B^0$ | $b^0 = 0 \rightarrow$ select bit value 0 |
| | | $b^0 = 0 \rightarrow$ select bit value 1 |
| $p(\text{basis } X) = \frac{1}{2^4}$ | $B^1$ | $b^1 = 0 \rightarrow$ select base Z |
| | | $b^1 = 1 \rightarrow$ select base X |
| p(vacuum) ≈ 0.059 | {$B^2$, $B^3$} | {$b_i^2 = 0, b_i^3 = 0$} → select signal |
| p(decoy) ≈ 0.059 | | {$b_i^2 = 1, b_i^3 = 1$} → select signal |
| p(signal) ≈ 0.882 | | {$b_i^2 = 1, b_i^3 = 0$} → select vacuum |
| | | {$b_i^2 = 0, b_i^3 = 1$} → select decoy |

The generation of the bit streams can be achieved by means of a quantum random number generator QRNG and three PRNGs. With the reference to the scheme below, at each iteration the QRNG $Q_i = \{q_{i,0} q_{i,1} q_{i,2} q_{i,3}\}$. Bit $q_{i,0}$ is directly used to select the qubit bit value, i.e., $q_{i,0}=b_i^0$. Since the QRNG is unbiased, $p(b_i^0=1)=1/2$ PRNG1 generates $L_i^1 = \{l_{i,0}^1 l_{i,1}^1 l_{i,2}^1 l_{i,3}^1\}$. Each of these bits is XORed with bit $q_{i,1}$, generating in this way $X_i^1 = \{x_{i,0}^1 x_{i,1}^1 x_{i,2}^1 x_{i,3}^1\}$. The bit value $b_i^1$ that will select the basis is then obtain by taking the AND reduction of the bits in $X_i^1$. It is obvious that $p(b_i^1=1)=1/2^4$.

PRNG2 and PRNG3 generate $L_i^2 = \{l_{i,0}^2 l_{i,1}^2 l_{i,2}^2 l_{i,3}^2\}$ and $L_i^3 = \{l_{i,0}^3 l_{i,1}^3 l_{i,2}^3 l_{i,3}^3\}$ respectively. The two words are respectively XORed with bits $q_{i,2}$ and $q_{i,3}$, generating in this way $X_i^2 = \{x_{i,0}^2 x_{i,1}^2 x_{i,2}^2 x_{i,3}^2\}$ and $X = \{x_{i,0}^3 x_{i,1}^3 x_{i,2}^3 x_{i,3}^3\}$. By taking the AND reduction of the bits in $X_i^2$ and $X_i^3$ bits $b_i^2$ and $b_i^3$ are obtained. At this point $p(b_i^3=1)=1/2^4$ and $p(b_i^3=1)=1/2^4$.

The vacuum event will be selected with a probability $p(b_i^2=1)(1-p(b_i^3=1)) \approx 0.059$. The decoy event will be selected with a probability $(1-p(b_i^2=1))p(b_i^3=1) \approx 0.059$. The signal event will be selected with a probability $p(b_i^2=1)p(b_i^3=1)+(1-p(b_i^2=1))(1-p(b_i^3=1)) \approx 0.882$.

Whilst certain embodiments have been described, these embodiments have been presented by way of example only, and are not intended to limit the scope of the inventions. Indeed, the novel devices, and methods described herein may be embodied in a variety of other forms; furthermore, various omissions, substitutions and changes in the form of the devices, methods and products described herein may be made without departing from the spirit of the inventions. The accompanying claims and their equivalents are intended to cover such forms or modifications as would fall within the scope and spirit of the inventions.

The invention claimed is:

1. A system for generating a biased random bit stream, wherein said biased bit stream has different predetermined probabilities of occurrence for bit "0" and bit "1", said system comprising:
a true random number generator configured to output a true random bit stream,
a pseudo random number generator configured to output a pseudo random bit stream, said pseudo random bit stream comprising n bit words, where n is an integer of at least two;
a combining circuit configured to combine each bit of an n-bit word from said pseudo random number generator with a same bit from the true random number generator to output a processed n-bit word; and
an output circuit configured to generate an output bit value from said processed n-bit word using a function, wherein said function is selected to control probabilities of occurrence of the bit "0" values and bit "1" values to be the different predetermined probabilities of occurrence.

2. The system of claim 1, wherein the combining circuit comprises a exclusive OR gate configured to exclusively OR each bit of said n-bit word with the same bit from said true random number generator.

3. The system of claim 2, wherein the output circuit comprises a processor configured to output a word value representing said word and compare said word value with a threshold, the processor being further configured to allocate a first bit value to word values above said threshold and allocate a second bit value for word values below said threshold, said first bit value selected from bit "1" and bit "0" and the second bit value being the other of bit "1" and bit "0", said threshold and said value of n being selected to control the probabilities of occurrence of the bit "0" values and bit "1" values to be the different predetermined probabilities of occurrence.

4. The system of claim 1, wherein the output circuit comprises a processor configured to output a word value representing said word by using a look up table.

5. The system of claim 1, wherein the output circuit comprises a plurality of logic units configured to logically combine the bit values of an n-bit word to produce a single bit value for said word, wherein n is selected to control the probabilities of occurrence of the bit "0" values and bit "1" values to be the different predetermined probabilities of occurrence.

6. The system of claim 5, wherein the plurality of logic units comprises a plurality of AND gates configured to combine the bit values within the n-bit word.

7. The system of claim 1, further configured to output a plurality of parallel random bit streams, wherein the true random number generator is configured to output a plurality of parallel true random bit streams, the combining circuit is configured to combine a bit from one of said plurality of parallel true random bit streams of said true random number generator with an n-bit word from said pseudo random number generator to output a processed n-bit word,
said output circuit being configured to generate an output bit value from each processed n-bit word to produce parallel output bit streams.

8. The system of claim 7, wherein the pseudo random number generator is configured to output a plurality of parallel pseudo random bit streams, each said pseudo random bit stream comprising n-bit words, wherein the pseudo random number generator is configured to allow n to be set independently for each of said parallel random bit streams.

9. The system of claim 8, wherein the combining circuit is further configured to combine each bit stream of said plurality of pseudo random bit streams with a bit stream from the plurality of parallel true random bit streams produced by the true random number generator to produce a plurality of parallel bit streams of processed words, and the output circuit is configured to generate output bit values from said parallel bit streams of processed words.

10. The system of claim 7, wherein at least one bit from the plurality of true random bit streams is produced by XORing two bits streams produced directly from said true random number generator.

11. The system of claim 1, wherein the true random number generator comprises a Quantum Random Number Generator.

12. The system of claim 11, wherein the quantum random number generator comprises gained-switched diode lasers.

13. The system of claim 1, wherein the pseudo random number generator comprises processing circuitry executing an algorithm adapted to generate random numbers.

14. The system of claim 1, wherein said combining circuit comprises an FPGA or ASIC.

15. The system of claim 13, wherein the output circuit comprises an FPGA or ASIC.

16. The system of claim 7, wherein the pseudo random number generator comprises a plurality of pseudo random number generators each outputting a bit stream of random numbers.

17. A sender for a quantum communication system, the sender comprising:
a quantum bit source configured to generate a plurality of quantum bits for sending to a receiver;
an intensity modulator configured to modulate an intensity of a portion of the generated quantum bits; and
a phase modulator configured to modulate a phase of the portion of the generated quantum bits, wherein the intensity modulator and phase modulator are configured to receive a biased output string from the system according to claim 1.

18. A receiver for a quantum communications system, the receiver comprising:
at least one detector for detecting received quantum bits;
a phase modulator configured to modulate a phase of a portion of the received quantum bits for measurement, wherein the phase modulator is configured to receive a biased output string from the system according to claim 1.

19. A quantum communication system, comprising:
a sender comprising:
a quantum bit source configured to generate a plurality of quantum bits for sending to a receiver; and
an intensity modulator configured to modulate an intensity of a portion of the generated quantum bits; and
a phase modulator configured to modulate a phase of the portion of the generated quantum bits; and
a receiver comprising:
at least one detector configured to detect received quantum bits;
a phase modulator configured to modulate the phase of the portion of the received quantum bits for measurement,
wherein at least one of the intensity modulator and phase modulator in the sender and the phase modulator in the receiver are configured to receive a biased output string from the system according to claim 1.

20. A method for generating a biased random bit stream, wherein said biased bit stream has different predetermined probabilities of occurrence for bit "0" and bit "1", said method comprising:
using a true random number generator configured to output a true random bit stream,
generating a pseudo random bit stream, said pseudo random bit stream comprising n bit words, where n is an integer of at least two;
combining each bit of an n-bit word from said pseudo random bit stream with a same bit from the true random number generator to output a processed n-bit word; and
generating an output bit value from said processed n-bit word using a function, wherein said function is selected to control probabilities of occurrence of the bit "0" values and bit "1" values to be the different predetermined probabilities of occurrence.

* * * * *